United States Patent [19]

Koschlig et al.

[11] Patent Number: 5,431,745
[45] Date of Patent: Jul. 11, 1995

[54] SOLDER SUSPENSION FOR THE APPLICATION OF THIN LAYERS OF SOLDER TO SUBSTRATES

[75] Inventors: Manfred Koschlig, Aschaffenburg; Wolfgang Weber, Karlstein; Klaus Zimmermann, Alzenau, all of Germany

[73] Assignee: Degussa Aktiengesellschaft, Frankfurt am Main, Germany

[21] Appl. No.: 226,048

[22] Filed: Apr. 11, 1994

[30] Foreign Application Priority Data

May 10, 1993 [DE] Germany .................. 43 15 475.1

[51] Int. Cl.⁶ ............................................. B23K 35/34
[52] U.S. Cl. ........................................ 148/24; 148/23
[58] Field of Search ............................. 148/24, 23

[56] References Cited

U.S. PATENT DOCUMENTS

| | | | |
|---|---|---|---|
| 3,762,965 | 10/1973 | Amin et al. | 148/24 |
| 3,832,242 | 8/1974 | Cuthbert | 148/24 |
| 3,971,501 | 7/1976 | Cooke | 228/248 |
| 4,231,815 | 11/1980 | Snyder et al. | 148/24 |
| 4,475,959 | 10/1984 | Liang et al. | 148/24 |
| 4,509,994 | 4/1985 | Barajas | 148/24 |
| 4,661,173 | 4/1987 | Barajas et al. | 148/24 |
| 4,981,526 | 1/1991 | Kudo et al. | 148/25 |
| 5,173,126 | 12/1992 | Ogura | 148/24 |
| 5,328,521 | 7/1994 | Keusseyan | 148/24 |

FOREIGN PATENT DOCUMENTS

| | | |
|---|---|---|
| 0005068 | 10/1979 | European Pat. Off. . |
| 0024484 | 3/1981 | European Pat. Off. . |
| 4131871 | 5/1992 | Germany . |

OTHER PUBLICATIONS

Office Action Dec. 9, 1993 German PO.

*Primary Examiner*—Peter D. Rosenberg
*Attorney, Agent, or Firm*—Beveridge, DeGrandi, Weilacher & Young

[57] ABSTRACT

A solder suspension is disclosed of solder powder, organic binder, organic solvent, and, if necessary, flux, with which it is possible to apply solder layers without cracks and pores to substrates by means of immersion or spraying. The solder powder must have a particle size of 5 to 50 μm, where 55 to 70% of the particles are smaller than the particle size at the maximum on the particle size distribution curve. In addition, the ratio between the average particle size of the solder powder and the density of the solder powder must be between 0.1 and 20.

10 Claims, No Drawings

SOLDER SUSPENSION FOR THE APPLICATION OF THIN LAYERS OF SOLDER TO SUBSTRATES

DESCRIPTION

The present invention relates to a solder suspension for the formation of thin layers of solder to substrates, composed of 30 to 90% by weight solder powder, 0.1 to 20% by weight of an organic binder, 1 to 50% by weight of an organic solvent, and 0 to 10% by weight of a flux.

In connecting parts whose points of connection have a complex geometry, soldering technology generally employs solder pastes, containing of solder powder, binder, solvent, and flux. These pastes have a defined viscosity which permits automatic processing, as performed by automated dosing apparatus. The automated dosing devices apply a defined quantity of the tough solder paste to a given location of the part being connected. Due to its viscosity, the amount of paste remains on the spot to which it was applied and only minimally alters in form. If the soldering location has a particularly complex geometry, the solder paste may be applied manually, e.g., with a brush or spatula. A disadvantage of these methods is that the machines for automatically applying the solder paste are very expensive and, in addition, frequently subject to repairs. The viscosity of the solder paste often leads to blockage of the dosing device, and appreciable disruptions in the process must be tolerated. Application of the solder paste with a brush requires manual work and thus is uneconomical in large scale production. When applied by a brush the paste cannot be applied with a high degree of uniformity due to its viscosity. Generally a flux additive for the solder paste is used, with the goal of assuring a uniform distribution of the solder at the point of soldering connection. These methods, however, do not usually assure a complete wetting of the point of connection, and in the finished component this results, e.g., in a loss of strength or in poor heat transfer.

To overcome these difficulties a procedure was to produce a solder suspension of solder powder, organic binder, larger quantities of organic solvents, and, if necessary, fluxes for the application of thin solder layers to the points of connection, for example, by means of immersion or spraying. For example, DE-PS 41 31 871 describes a process for applying layers of a mechanically resistant substance to metallic substrates, in which the resistant substance particles and the solder powder are worked into a suspension with 0.1 to 20% by weight of an organic binder and 1 to 50% by weight of an organic solvent and are applied to substrates in layers of a thickness between 10 and 500 $\mu$m. The powder particles here have an average particle size of less than 20 $\mu$m. To be sure it was not necessary to produce uniform solder layers without cracks and pores. Such cracks and pores in the solder layer are the result, however, when the solder suspensions according to DE-PS 41 31 871, which do not contain mechanically resistant substances, are used.

SUMMARY OF THE INVENTION

An object of the present invention is to develop a solder suspension for applying thin layers of solder to substrates to form thin, uniform, firmly adhesive layers by means of immersion or spraying and which layers do not form cracks and pores after drying.

In carrying out the invention, a solder composition is used comprising 30 to 90% by weight solder powder, 0.1 to 20% by weight of an organic binder, 1 to 50% by weight of an organic solvent, and 0 to 10% by weight of a flux.

A feature of the invention is that the solder powder used in the solder composition has a particle size of 5 to 50 $\mu$m, with a particle distribution in which 55 to 70% of the particles are smaller than the particle size at the maximum of the particle size distribution curve, and the ratio between the average particle size of the solder powder, measured in $\mu$m, and the density of the solder powder, measured in g cm$^{-3}$, is between 0.1 and 20.

Thus, by preparing a particle size distribution curve for a selected solder powder which is within the scope of a person skilled in this field of technology it is possible to formulate a solder powder having the necessary criteria as set forth.

The particle size is preferably between 5 and 30 $\mu$m, where 60 to 65% of the particles are smaller than the particle size at the maximum of the particle size distribution curve. The ratio between the average particle size for the solder powder and the density of the solder powder is advantageously between 0.5 and 5 ($\mu$m·g$^{-1}$·cm$^3$) for nickel and copper solders and between 2 and 17 ($\mu$m·g$^{-1}$·cm$^3$) for aluminum solders.

DETAILED DESCRIPTION OF INVENTION

In accordance with the present invention, it was determined that homogeneous solder layers without cracks and pores can be produced on a variety of substrates from solder suspensions when there are more powder particles of smaller size than particles of larger size. Thus, the particle size distribution curve must not run symmetrically to the maximum for particle size, but asymmetrically.

In this manner it is possible to obtain solder suspensions that provide a non-running coating and a resulting solder layer on substrates that is free of cracks and pores. The solder composition is applied to the substrate by means of immersion or spraying and a subsequent drying process. Here it is of special significance that in its condition immediately after drying, i.e., before the actual soldering process, the coating exhibit an absolutely uniform distribution of solder particles in the binder matrix—since the binder matrix can only be filled in the soldering process by large solder excesses, which, however, are undesirable in most joining processes.

Depending on its adjusted viscosity the resulting solder suspension (binder/solvent ratio) is suitable for treatment by immersion of the parts or treatment in a compressed air spraying gun (varnishing sprayer). Because of its defined composition, the suspension applied to the substrates has only a slight tendency to form drops and to run, so that layers of a definite thickness can be applied.

After applying the layer of desired thickness to the substrate, the parts are dried in a furnace and then soldered by heating to the soldering temperature. In the soldering process the baking temperature must maintained for several minutes to permit baking, or burn out, of the binder, depending on the layer thickness. For a layer thickness less than 20 $\mu$m (after drying) this baking step may be omitted. For a layer thickness between 20 and 100 $\mu$m, baking periods of 10 to 15 minutes are recommended (temperature between 300° and 500° C. depending on the binder system employed). This is important for complete wetting and for producing a defect-free solder layer without cracks and pores. The result is soldering connections that are wetted by the solder composition over the entire area, even on connecting points with a complex geometry.

A wide variety of substrate can be soldered in accordance with the present invention there being no criticality in the nature of the metal, metallic or ceramic substrate.

To obtain stable solder suspensions, the ratio between the average particle size of the powder (in $\mu$m) and the density of the material (in g/cm) must lie in a range between 0.1 and 20; the difference in each case will depend on the solder material. The ideal range, e.g., for copper and nickel solders, is between 5 and 0.5; for aluminum solders it is between 17 and 2. If this range is not observed, either the powder particles in the suspension will tend to settle or, when the powder is too fine, too much binder will have to be added —which manifests itself in the soldering process by irregularities in the layer. If required, a flux powder may be added.

The binder system consists of any well known organic thermoplastic polymer binder used for this purpose, e.g., from the class of polyacrylates, polybutenes, polystyrenes, or cellulose derivatives. These substances are conventional and well known in the art. An inert volatile organic solvent, e.g., from the class of hydrocarbons, glycol ethers, glycol esters, alcohols, and ketones, with evaporation coefficients between 10 and 10,000 can be used. Theses are also conventional and well known for this technique.

Proportions of binder and solvent can vary as will be apparent to those skilled in the art and are not narrowly critical. Sufficient binder and solvent are employed to enable preparations that will function in the intended manner to produce the desired covering effect of the solder composition over complex surfaces.

If necessary, e.g., when an aluminum solder is used, a flux is added. Such fluxes are also well known in the art. Too rapid a precipitation of the solder powder in the suspension can also be prevented by the addition of rheological additives. By varying the organic binder and organic solvent that are added and amounts, the viscosity of the solder composition suspension can be adjusted in such a way that solder layers of 10 to 500 $\mu$m can be applied by immersion or spraying. Hence, this relationship defines the quantities of binder and solvent employed. It is preferable to set kinematic viscosities in the range from 0.1 to 1.5 Pas, given a shear rate of D=200 s$^{-1}$. The suspensions here contain 0.1 to 20% of the organic binder and 1 to 50% of the organic solvent. Applying the coatings to the parts to be soldered can be performed in such a defined and economical way with the desired goal in mind that, particularly when nickel solders are used, brittle phases do not form during soldering through the escape of solder at undesired points. After application of the solder layer, the coated parts are dried in a drying chamber at a temperature between 50° and 150° C., preferably at about 110° C. Preceding the actual soldering process is an elevated temperature stage in which the binder is baked at a temperature that is dependent on the employed binder system.

This elevated temperature stage for baking is performed at 300° to 650° C., preferably at 500° C.

As will be apparent to those skilled in the art, the specific solders that can be used in accordance with the invention can vary widely. There is no criticality regarding solder compositions suitable for this purpose. Any suitable solder can be used of which a few are illustrated below. Ni solders, Cu solders and aluminum solders are well known types of solders that can be used. These solder suspensions are also suited for connecting ceramic parts with each other or ceramic parts with metal parts and for metallizing a ceramic. An activator (titanium or zirconium powder) of the necessary quantity (about 10%) is added to the suspension of solder powder and binder in a dispersing device and the suspension is mixed. The viscosity of the suspension is adjusted in such a way that the suspension is suitable either for the immersion of parts or for treatment with sprayers.

The following examples will explain the invention in greater detail:

EXAMPLE 1

400 g of a nickel solder (89% Ni, 11% P) are milled in a ball mill to an average granular size of 8 $\mu$m. The maximum of the particle size distribution curve was 15 $\mu$m, and about 65% of the particles were smaller than 15 $\mu$m. With a mixture of 5.5 g of polyisobutylene and 87 g of light gasoline the powder was worked into a homogeneous suspension in a dispersing device, with a kinematic viscosity of 0.9 Pas (D=200 s$^{-1}$); with this suspension a layer of about 70 $\mu$m thickness can be applied with a single immersion. After drying, this solder layer was entirely free of cracks and pores. The thickness of the employed solder was 8.13 g/cm$^3$, so that the ratio between the average particle size and the density of the solder powder was 1.85 $\mu$m·g$^{-1}$·cm$^3$.

EXAMPLE 2

400 g of a copper solder (94% Cu, 6% P) are ground into a powder with an average particle size of 20 $\mu$m, with a maximum of the particle size distribution curve at 28 $\mu$m. About 60% of the particles were smaller than 28 $\mu$m. 40 g titanium powder (average particle size 5 $\mu$m) were then added and the mixture was mixed together with 5.5 g polyisobutylene and 94 g light gasoline in a dispersing device for about 30 minutes. The result is a suspension that can be sprayed onto parts in a thin layer with a compressed air gun (nozzle diameter 1.2 mm). The adjusted kinematic viscosity is 0.3 Pas (D=200 s$^{-1}$). The resulting crack-free layer of about 20 $\mu$m thickness may serve in metallizing a ceramic or in joining ceramic to ceramic or ceramic to metal, particularly when the connecting point has a complex geometry.

The solder powder had a density of 8.1 g/cm$^3$. The ratio of the average particle size and the solder powder density was thus 2.47 $\mu$m·g$^{-1}$·cm$^3$.

EXAMPLE 3

200 g of an aluminum solder (88% Al, 12% Si) is ground to an average particle size of 20 $\mu$m. The maximum of the particle size distribution curve was 32 $\mu$m, and about 70% of the particles were smaller than 32 $\mu$m. This solder powder is homogenized with 200 g flux powder, 18 g polyisobutylene, and 330 g light gasoline in a dispersing device. The resulting suspension with a kinematic viscosity of 0.6 Pas (D=200 s$^{-1}$) can be employed in the immersion of parts. The layer thicknesses on the immersed parts are about 200 $\mu$m. This method may be applied, e.g, in connecting heating conductors of aluminum to water throughput pipes in instantaneous water heaters. The density of the solder powder was 2.65 g/cm³, and the ratio of average particle size to density was 7.55 μm·g⁻¹·cm³.

EXAMPLE 4

400 g of a copper solder (87% Cu, 10% Mn, 3% Co) are ground to an average particle size of 10 μm, with a maximum on the particle size distribution curve of 18 μm. About 62% of the solder particles were smaller than 18 μm. This powder is mixed together with 33 g polyacrylate and 100 g xylene in a dispersing device. After about 20 minutes the result is a suspension with which the immersed parts can be coated with a layer which has a thickness of about 50 μm and which exhibits neither cracks or pores after drying.

The density of the solder powder was 8.8 g/cm³ and the ratio of average particle size to density was 2.05 μm·g⁻¹·cm³.

Further variations and modifications of the foregoing will be apparent to those skilled in the art from a reading hereof and are intended to be encompassed by the appended claims.

German priority application P 43 15475.1 is relied on and incorporated herein by reference.

We claim:

1. A solder suspension for the formation of a solder layer to a substrate, comprising 30 to 90% by weight of a solder powder, 0.1 to 20% by weight of volatilizable organic binder, 1 to 50% by weight of an organic solvent, and 0 to 10% by weight of a flux, wherein the solder powder has a particle size of 5 to 50 μm, with a particle size distribution curve in which 55 to 70% of the particles are smaller than the particle size of the maximum on the particle size distribution curve for the solder powder, and the ratio between the average particle size of the solder powder, measured in μm, and the density of the solder powder, measured in g/cm³ is between 0.1 and 20.

2. The solder suspension according to claim 1, wherein the particle size is between 5 and 30 μm, where 60 to 65% by weight of the particles are smaller than the particle size of the maximum on the particle size distribution curve.

3. The solder suspension according to claim 1 wherein the ratio between the average particle size of the solder powder and the density of the solder powder for nickel and copper solders is between 0.1 and 5 (μm·g⁻¹·cm³) and for aluminum solders is between 2 and 17 (μm·g⁻¹·cm³).

4. The solder suspension according to claim 1 wherein the solder suspension also contains titanium or zirconium powder.

5. The solder suspension according to claim 1 wherein the binder and solvent are selected so that the viscosity of the suspension enables solder layers of 10 to 500 μm to be applied by immersion or spraying.

6. The solder suspension according to claim 5 wherein the viscosity ranges from 0.1 to 1.5 Pas at a shear rate of D=200 5'.

7. The solder suspension according to claim 1 wherein the solder powder is selected from the group consisting of nickel solders, copper solders and aluminum solders.

8. A method of soldering comprising forming a solder suspension comprising 30 to 90% by weight of a solder powder, 0.1 to 20% by weight of organic binder, 1 to 50% by weight of an organic solvent, and 0 to 10% by weight of a flux, wherein the solder powder has a particle size of 5 to 50 μm, with a particle size distribution curve in which 55 to 70% of the particles are smaller than the particle size of the maximum on the particle size distribution curve, and the ratio between the average particle size of the solder powder, measured in μm, and the density of the solder powder, measured in g/cm³, is between 0.1 and 20, applying a layer of said suspension to at least one of a plurality of parts to be joined together by solder, drying said parts at a temperature of 50° to 150° C., increasing a temperature of 300° to 650° C. and thereafter heating to the soldering temperature.

9. Two parts, one of metal and one of ceramic or metal soldered together using the solder suspension of claim 1.

10. Two ceramic parts soldered together using the solder suspension of claim 1.

* * * * *